(12) United States Patent
Kim

(10) Patent No.: US 10,236,309 B2
(45) Date of Patent: Mar. 19, 2019

(54) DISPLAY DEVICE AND MANUFACTURING METHOD THEREOF

(71) Applicant: Samsung Display Co., Ltd., Yongin-si, Gyeonggi-do (KR)

(72) Inventor: Jong Yun Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 4 days.

(21) Appl. No.: 15/783,820

(22) Filed: Oct. 13, 2017

(65) Prior Publication Data
US 2018/0108685 A1   Apr. 19, 2018

(30) Foreign Application Priority Data
Oct. 14, 2016 (KR) .................. 10-2016-0133560

(51) Int. Cl.
*H01L 27/12* (2006.01)
*H01L 27/32* (2006.01)
*H01L 51/00* (2006.01)

(52) U.S. Cl.
CPC ...... *H01L 27/1248* (2013.01); *H01L 27/1262* (2013.01); *H01L 27/3258* (2013.01); *H01L 27/3262* (2013.01)

(58) Field of Classification Search
USPC ......................................... 257/72
See application file for complete search history.

(56) References Cited

U.S. PATENT DOCUMENTS

2015/0102316 A1*   4/2015   Park .................... H01L 27/3258
                                                            257/40

FOREIGN PATENT DOCUMENTS

| KR | 10-2006-0055612 A | 5/2006 |
| KR | 10-2011-0095653 A | 8/2011 |
| KR | 10-2016-0053001 A | 5/2016 |
| KR | 10-2016-0139115 A | 12/2016 |

* cited by examiner

*Primary Examiner* — Moazzam Hossain
*Assistant Examiner* — Lawrence C. Tynes, Jr.
(74) *Attorney, Agent, or Firm* — Innovation Counsel LLP

(57) ABSTRACT

A display device according to an exemplary embodiment includes: a substrate including a pixel area and a transmission area adjacent to the pixel area; a transistor positioned on the substrate in the pixel area; a planarization layer positioned on the transistor in the pixel area; a wall positioned on the substrate between the pixel area and the transmission area; and a pixel electrode positioned on the planarization layer and extending in a trench between the planarization layer and the wall.

20 Claims, 14 Drawing Sheets

DISPLAY DEVICE AND MANUFACTURING METHOD THEREOF

CROSS-REFERENCE TO RELATED APPLICATION

This application claims priority to and the benefit of Korean Patent Application No. 10-2016-0133560 filed in the Korean Intellectual Property Office on Oct. 14, 2016, the entire contents of which are incorporated herein by reference.

BACKGROUND (a) Technical Field

This disclosure relates to a display device and a manufacturing method thereof.

(b) Description of the Related Art

Recently, for a display device, such as an organic light emitting diode display, research on a transparent display with improved light transmittance has been progressing. The display device generally includes a plurality of layers, and in this case, the light transmittance of the display device may be changed depending on an arrangement and a formation material of these layers. For example, the transparent display may include a transmission area where the layers that deteriorate transmittance are removed. However, problems may be generated due to the removed layers of the transmission area.

The above information disclosed in this Background section is only for enhancement of understanding of the background of the invention, and therefore, it may contain information that does not form the prior art that is already known in this country to a person of ordinary skill in the art.

SUMMARY

Exemplary embodiments provide a display device and a manufacturing method thereof for preventing corrosion and protrusions of a pixel electrode and minimizing usage of a photoresist.

A display device according to an exemplary embodiment includes: a substrate including a pixel area and a transmission area adjacent to the pixel area; a transistor positioned on the substrate in the pixel area; a planarization layer positioned on the transistor in the pixel area; a wall positioned on the substrate between the pixel area and the transmission area; and a pixel electrode positioned on the planarization layer and extending in a trench between the planarization layer and the wall.

The wall and the planarization layer may be formed of a same material.

An edge of the pixel electrode may be positioned in the trench.

The display device may further include a pixel definition layer positioned on the pixel electrode, and the pixel definition layer may cover the edge of the pixel electrode in the trench.

The wall may be separated from the planarization layer.

The display device may further include a gate insulating layer positioned between a semiconductor of the transistor and a gale electrode, and the wall may be positioned directly on the gate insulating layer.

The pixel electrode may be in contact with the gate insulating layer in the trench.

The display device may further include a light emission member positioned on the pixel electrode and a common electrode positioned on the light emission member, and the common electrode may be in contact with one side of the wall.

The common electrode may be in contact with the gate insulating layer in the transmission area.

The wall may be connected to the planarization layer.

The display device may further include an interlayer insulating layer positioned between a gate electrode of the transistor and source and drain electrodes, and the wall may be positioned directly on the interlayer insulating layer.

The light emission member may be positioned between the gate insulating layer and the common electrode in the transmission area.

The display device may be a transparent display.

A manufacturing method of a display device according to an exemplary embodiment includes: forming a transistor in a pixel area on a substrate including the pixel area and a transmission area adjacent to the pixel area; depositing and etching an insulating material in the pixel area and the transmission area to form a planarization layer in the pixel area and to form a wall between the pixel area and the transmission area; and depositing and etching a conductive material to form a pixel electrode positioned on the planarization layer and extending in a trench between the wall and the planarization layer.

The pixel electrode may be formed for an edge to be positioned in the trench.

The method may further include depositing and etching an insulating material an the pixel electrode to form a pixel definition layer covering the pixel electrode in the trench.

The step of forming the transistor may include depositing and etching a conductive material on the gate insulating layer to form a gate electrode.

The pixel electrode may be formed to be in contact with the gate insulating layer in the trench.

An etching preventing layer may be formed in the transmission area when forming the gate electrode.

The method may further include forming a light emission member on the pixel electrode and forming a common electrode on the light emission member, wherein the common electrode may be formed to be in contact with one side of the wall.

The common electrode may be formed to be in contact with the gate insulating layer in the transmission area.

According to an exemplary embodiment, corrosion and protrusions of the pixel electrode may be prevented, and a consumption amount of a photoresist may be reduced.

DETAILED DESCRIPTION OF THE EMBODIMENTS

Figure 1:
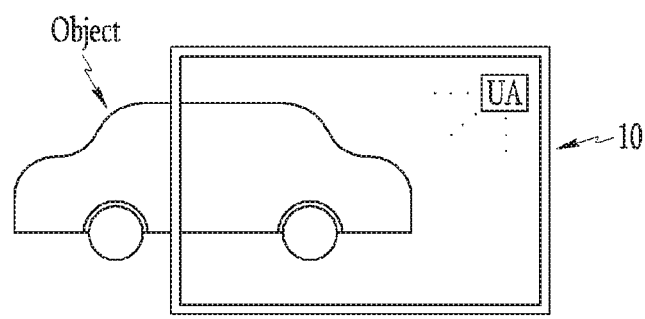
FIG. 1 is a view schematically showing a display device according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

For the purpose of explaining the present invention, portions that are not directly related to the present invention are omitted, and the same reference numerals are attached to the same or similar constituent elements throughout the entire specification.

In addition, the size and thickness of each configuration shown in the drawings are arbitrarily shown for better understanding and ease of description, but the present invention is not limited thereto. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will be understood that to be referred to as being "above" or "on" a reference portion is to be located above or below the reference portion.

In addition, unless explicitly described to the contrary, the word "comprise" and variations such as "comprises" or "comprising" will be understood to imply the inclusion of stated elements but not the exclusion of any other elements.

Further, in the specification, the phrase "in a plan view" means when an object portion is viewed from above, and the phrase "in a cross-section" means when a cross-section taken by vertically cutting an object portion is viewed from the side.

Next, a display device according to an exemplary embodiment of the present invention will be described with reference to accompanying drawings. Although an organic light emitting diode display is described as an example, the display device according to the present invention is not limited thereto.

Figure 2:
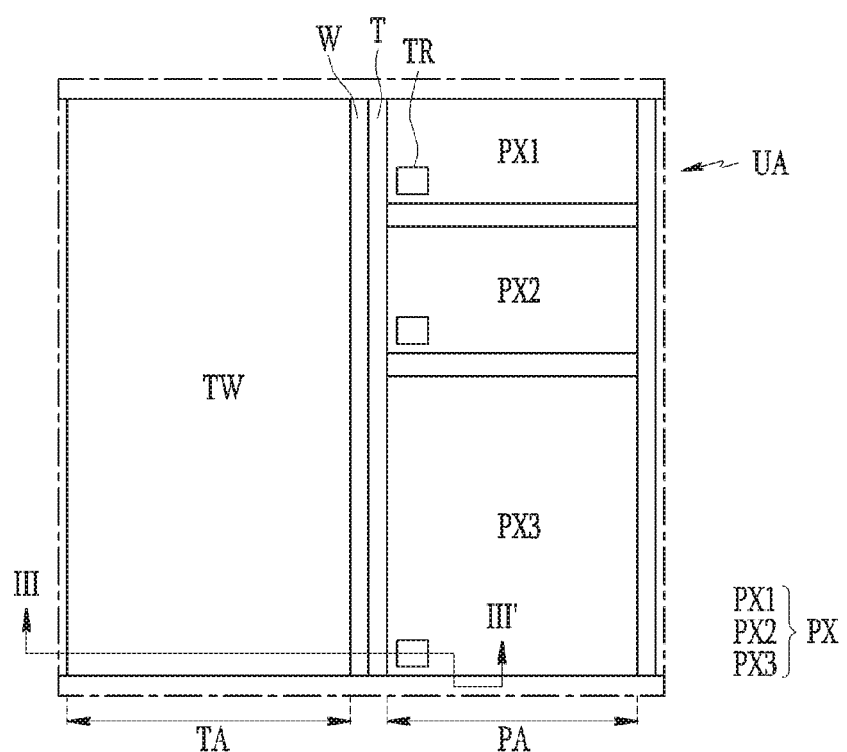
FIG. 2 is a layout view schematically showing a unit region of a display device shown in FIG. 1.

FIG. 1 is a view schematically showing a display device according to an exemplary embodiment of the present invention, and FIG. 2 is a layout view schematically showing a unit region of a display device shown in FIG. 1.

Referring to FIG. 1, a display device 10 may have transparent properties and allow an object or a background positioned behind the display device 10 to be visible there through, like a window. This display device 10 is referred to as a transparent display. The transparent display may be utilized, for example, as a showcase, glass of an automobile, and a window of a building for transmitting detail information and a function of a product to be utilized to provide various information. The transparent display may be applied to various objects, and may be combined with content that is interactive with the objects. For example, the transparent display may be combined with an augmented reality technology.

Referring to FIG. 2, the display device 10 includes a transmission area TA and a pixel area PA. The transmission area TA and the pixel area PA may be alternately disposed in a horizontal direction, for example. A region between the transmission area TA and the pixel area PA in the horizontal direction may be referred to as a border area.

A transmitting window TW substantially transmitting external light is positioned in the transmission area TA, and a pixel PX as a minimum unit displaying an image is positioned in the pixel area PA. In the display device 10, a unit area UA, for example including one pixel PX and one transmitting window TW, may be disposed in a matrix form. Due to the transmitting window TW of the transmission area TA, the display device 10 may be substantially or entirely recognized to be transparent.

The pixel PX may include a first pixel PX1, a second pixel PX2, and a third pixel PX3. The first pixel PX1, the second pixel PX2, and the third pixel PX3 may display different colors. For example, the first pixel PX1 may display red, the second pixel PX2 may display green, and the third pixel PX3 may display blue. The pixel PX may express various colors and a contrast by a combination of the first pixel PX1, the second pixel PX2, and the third pixel PX3. A pixel PX may further include a pixel displaying another color (e.g., white) as well as the first pixel PX1, the second pixel PX2, and the third pixel PX3. The first pixel PX1, the second pixel PX2, and the third pixel PX3 configuring the pixel PX may be referred to as subpixels.

The first pixel PX1, the second pixel PX2, and the third pixel PX3 may have different sizes. In FIG. 2, the third pixel PX3 is shown to be largest, but it is not limited thereto, and the sizes of the first pixel PX1, the second pixel PX2, and the third pixel PX3 may be variously changed. Also, the sizes of at least two pixels among the first pixel PX1, the second pixel PX2, and the third pixel PX3 may be substantially the same.

Each of the pixels PX1, PX2, and PX3 includes a transistor TR, for example, for controlling or turning on/off a current to the pixel. Although one transistor TR is shown, each pixel may include two or more transistors TR. Although not shown, each of the pixels PX1, PX2, and PX3 may include at least one capacitor.

The transmitting window TW minimizes a loss of transmittance and transmits external light. The transmitting window TW may have a plane shape of a quadrangle, but it is not limited thereto. In FIG. 1, one transmitting window TW is adjacent to the pixel PX to correspond to one pixel PX. Alternatively, transmitting windows TW that are divided into three may be positioned adjacent to the first pixel PX1, the second pixel PX2, and the third pixel PX3 to correspond to the pixels PX1, PX2, and PX3, and one transmitting window TW may be positioned adjacent to four or more pixels to correspond to these pixels. A wire (not shown) for transmitting a signal applied to the pixel PX, for example, a scan line transmitting a scan signal, may be positioned between transmitting windows TW adjacent in a vertical direction.

A wall W is positioned between the transmitting window TW and the pixel PX, and a trench T is positioned between the wall W and the pixel PX. The transmission area TA and the pixel area PA may be divided by the wall W and the trench as a border. Accordingly, the wall W may limit sides of the transmitting window TW adjacent to the pixel area PA. The wall W and the trench T may reduce usage of a photoresist in a formation process of a pixel electrode to be described later, and may prevent a failure of the pixel electrode.

Next, the display device according to an exemplary embodiment of the present invention will be described in detail with reference to FIG. 3 while focusing on the transmitting window TW, the pixel PX, the wall W, and the trench T.

Figure 3:
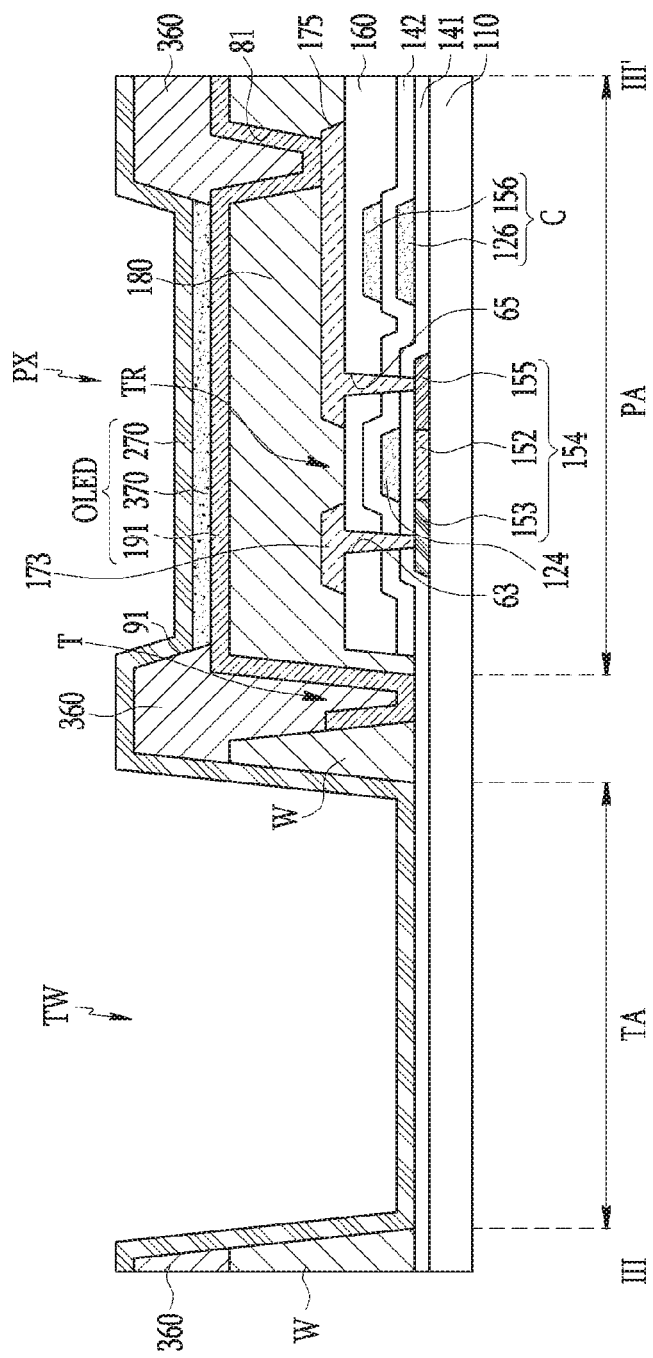
FIG. 3 is a schematic cross-sectional view taken along a line of FIG. 2.

FIG. 3 is a schematic cross-sectional view taken along a line III-III' of FIG. 2.

Referring, to FIG. 3, the display device includes the transmitting window TW positioned in the transmission area TA of a substrate 110, the pixel PX positioned in the pixel area PA of the substrate 110, and the wall W and the trench T positioned between the transmitting window TW and the pixel PX.

The substrate 110 may be a transparent insulation substrate made of glass, quartz, ceramic, plastic, etc.

A semiconductor 154 of the transistor TR is positioned on the substrate 110. The semiconductor 154 includes a channel region 152, and a source region 153 and a drain region 155 that are positioned at respective sides of the channel region 152 and are doped. The semiconductor 154 may include a polysilicon, an amorphous silicon, or an oxide semiconductor.

Although not shown, a light blocking electrode may be positioned between the substrate 110 and the semiconductor 154. The light blocking electrode prevents external light from reaching the semiconductor 154 such that a characteristic deterioration of the semiconductor 154 may be blocked and a leakage current of the transistor TR may be minimized. A barrier layer (not shown) for preventing diffusion of impurities, which cause degradation of semiconductor characteristics and moisture penetration, may be disposed between the substrate 110 and the semiconductor 154.

A first gate insulating layer 141 is positioned on the semiconductor 154. The first gate insulating layer 141 may be positioned throughout the entire surface of the substrate 110, and accordingly, it may be positioned in the transmission area TA. According to an embodiment different from the exemplary embodiment shown in FIG. 3, the first gate insulating layer 141 may not be positioned in the transmission area TA. The first gate insulating layer 141 may include an inorganic insulating material such as a silicon oxide (SiOx), a silicon nitride (SiNx), etc.

A first gate conductor including a gate electrode 124 of the transistor TR, a first electrode 126 of the capacitor C, a scan line (not shown), and the like is positioned on the first gate insulating layer 141. The gate electrode 124 may overlap the channel region 152 of the semiconductor 154.

A second gate insulating layer 142 including an inorganic insulating material positioned on the first gate conductor. A second gale conductor including a second electrode 156 of the capacitor C, a storage line (not shown), and the like is positioned on the second gate insulating layer 142. The second electrode 156 overlaps the first electrode 126 with the second gate insulating layer 142 interposed therebetween, and they may form the capacitor C that may be a storage capacitor of the pixel. The first and second gate conductors may include a metal such as molybdenum (Mo), copper (Cu), aluminum (Al), silver (Ag), chromium (Cr), tantalum (Ta), titanium (Ti), and the like, or metal alloys thereof, and may be formed of a single layer or a multilayer. According to an embodiment different from the exemplary embodiment shown in FIG. 3, the display device may not include the second gate insulating layer 142 and the second gale conductor.

An interlayer insulating layer 160 including an inorganic insulating material is positioned on the second gate conductor. The second gale insulating layer 142 and the interlayer insulating layer 160 are positioned in the pixel area PA, but they may not be positioned in the transmitting window TW of the transmission area TA, which improves the transmittance. In the pixel area PA, the edges of the second gate insulating layer 142 and the interlayer insulating layer 160 may be substantially matched.

A data conductor including a source electrode 173 and a drain electrode 175 of the transistor TR, a data line not shown), a driving voltage line (not shown), and the like, is positioned on the interlayer insulating layer 160. The source electrode 173 and the drain electrode 175 may be respectively connected to the source region 153 and the drain region 155 of the semiconductor 154 through contact holes 63 and 65 formed in the interlayer insulating layer 160 and the second gate insulating layer 142. The data conductor may include a metal such as aluminum (Al), copper (Cu), silver (Ag), gold (Au), platinum (Pt), palladium (Pd), nickel (Ni), molybdenum (Mo), tungsten (W), titanium (Ti), chromium (Cr), tantalum (Ta), and the like, or a metal alloy thereof, and may be formed of a single layer or a multilayer (e.g., Ti/Al/Ti, Mo/Al/Mo, Mo/Cu/Mo, and the like).

The gate electrode 124 the source electrode 173, and the drain electrode 175 together form the transistor TR along with the semiconductor 154. The shown transistor may be a driving transistor of the pixel of the organic light emitting diode display. The shown transistor may be referred to a top-gate transistor since the gate electrode 124 is positioned on the semiconductor 154. The structure of the transistor is not limited thereto and may be variously changed; for example, it may be a bottom-gate transistor in which the gale electrode is positioned under the semiconductor.

A planarization layer 180 is positioned on the interlayer insulating layer 160 and the data conductor. The planarization layer 180 serves to remove and planarize a step in order to increase emission efficiency of the organic light emitting element to be formed thereon. The planarization layer 180 may be positioned to cover the second gate insulating layer 142, the interlayer insulating layer 160, and the data conductor in the pixel area PA. Accordingly, the planarization layer 180 may cover the transistor TR.

The planarization layer 180 is not positioned in the transmitting window TW of the transmission area TA, which results in transmittance improvement. The wall W is positioned on the first gate insulating layer 141 between the transmission area TA and the pixel area PA. The wall W is separated from the planarization layer 180, for example, in the horizontal direction, by a predetermined interval, and accordingly, the trench T is formed between the wall W and the planarization layer 180. The trench T is limited by the facing sides of the wall W and the planarization layer 180. Referring to FIG. 2, the trench T may be formed to be parallel to the vertical direction, for example, along the edge of the pixel PX. The trench T allows a thick photosensitive film to be formed when forming a pixel electrode 191 by etching such that the pixel electrode 191 may be prevented from being corroded. The detailed description with regard to a manufacturing method thereof is given later.

The planarization layer 180 and the trench T may include an organic insulating material. The organic insulating material may include polyimide, polyamide, polyacrylate, polyphenylene ether, polyphenylene sulfide, unsaturated polyester, an epoxy resin, phenol resin, and the like, but it is not limited thereto. The planarization layer 180 and the wall W may be formed of the same material.

The pixel electrode 191 is positioned on the planarization layer 180. The pixel electrode 191 is connected to the drain electrode 175 of the transistor TR through a contact hole 81 of the planarization layer 180. The pixel electrode 191 extends in the trench T along the side of the planarization layer 180. The pixel electrode 191 may be in contact with the first gate insulating layer 141 in the trench T. In the trench T, as shown, the edge of the pixel electrode 191 may be positioned at the side of the wall W. Alternatively, the edge of the pixel electrode 191 may be positioned on the first gate insulating layer 141 or may be positioned at the side of the planarization layer 180. The pixel electrode 191 may be formed of a reflective conductive material or a semi-transmittance conductive material, or may be formed of a transparent conductive material. For example, the pixel electrode 191 may include a transparent conductive material such as indium tin oxide (ITO) and indium zinc oxide (IZO), or a metal such as lithium (Li), calcium (Ca), aluminum (Al), silver (Ag), magnesium (Mg), and gold (Au).

A pixel definition layer 360 is positioned on the planarization layer 180 and the pixel electrode 191. The pixel definition layer 360 has an opening 91 overlapping a part of the pixel electrode 191. The opening 91 of the pixel definition layer 360 may limit the region corresponding to the pixel. The pixel definition layer 360 may be positioned to enclose the pixel in the pixel area PA, but it is not positioned in the transmitting window TW to prevent the transmittance deterioration. The pixel definition layer 360 may include an organic insulating material such as polyimide, polyacrylate, and polyamide.

The pixel definition layer 360 is positioned to fill the trench T. The planarization layer 180 is not positioned in the trench T, and as such, the pixel definition layer 360 is thickly formed in the trench T. Accordingly, the edge of the pixel electrode 191 positioned in the trench T is clad by the thick pixel definition layer 360. The edge of the pixel electrode 191 may be swollen by a chemical reaction over time. When the pixel definition layer 360 is thinly formed on the edge of the pixel electrode 191, the pixel electrode 191 may break through the pixel definition layer 360 and come into contact with a common electrode 270 to be described later. If this occurs, the pixel electrode 191 and the common electrode 270 become shorted, and the corresponding pixel no longer functions as the pixel but appears as a dark point. The pixel electrode 191 according to an exemplary embodiment of the present invention is covered by the thick pixel definition layer 360 such that even if the pixel electrode 191 is swollen, the pixel definition layer 360 is difficult to break.

A light emission member 370 is positioned on the pixel electrode 191. The light emitting member 370 may include a first organic common layer, an emission layer, and a second organic common layer that are laminated in sequence. The first organic common layer may include at least one of a hole injection layer and a hole transporting layer. The light emission layer may be made of an organic material that uniquely emits light of one of primary colors such as red, green, and blue, and may have a structure in which a plurality of organic material layers emitting light of different colors are laminated. The second organic common layer may include at least one of an electron transporting layer and an electron injection layer. In the exemplary embodiment shown in FIG. 3, the light emission member 370 is not positioned in the transmission area TA, but it may be positioned in the transmission area TA.

The common electrode 270 transmitting a common voltage is positioned on the light emission member 370. The common electrode 270 may include the transparent conductive material such as indium tin oxide (ITO) and indium zinc oxide (IZO). The common electrode 270 is made of a transparent conductive material, or may formed by thinly laminating metals such as calcium (Ca), barium (Ba), magnesium (Mg), aluminum (Al), and silver (Ag) to have a light transmitting property. The common electrode 270 may be positioned in the transmission area TA as well as the pixel area PA. The common electrode 270 may be in contact with one side of the wall W. Although not shown, at least one protection layer or functional layer may be positioned on the common electrode 270.

The pixel electrode 191, the light emission member 370, and the common electrode 270 of each pixel form a light-emitting element of an organic light emitting diode. Here, the pixel electrode 191 may be an anode as a hole injection electrode, and the common electrode 270 may be a cathode as an electron injection electrode. In other embodiments, the pixel electrode 191 may be the cathode, and the common electrode 270 may be the anode. Holes and electrons are injected into the light emission member 370 from the pixel electrode 191 and the common electrode 270, respectively, and exitons generated by coupling the injected holes and electrons fall from an excited state to a ground state to emit light.

In the exemplary embodiment shown in FIG. 3, the first gate insulating layer 141 and the common electrode 270 are positioned in the transmission layer TW of the transmission area TA among the several layers positioned in the pixel area PA; however, the semiconductor, the first gate conductor, the second gate insulating layer 142, the second gate conductor, the interlayer insulating layer 160, the data conductor, the planarization layer 180, and the pixel electrode are not positioned therein. The layers that are not transparent or the layers that are thick with transparency are not positioned in the pixel area PA, and as such, the transmitting window TW may transmit the external light with high transmittance. According to an embodiment differently from the exemplary embodiment shown in FIG. 3, in the transmission layer TW, one or both of the first gate insulating layer 141 and the common electrode 270 may not be positioned therein, or at least one layer that is positioned or not in the pixel area PA may be positioned therein.

Next, an exemplary embodiment of a method for manufacturing the display device shown in FIG. 3 will be described with reference to FIG. 4 to FIG. 12.

FIG. 4 to FIG. 12 are process cross-sectional views showing a manufacturing method of a display device according to an exemplary embodiment of the present invention.

Figure 4:
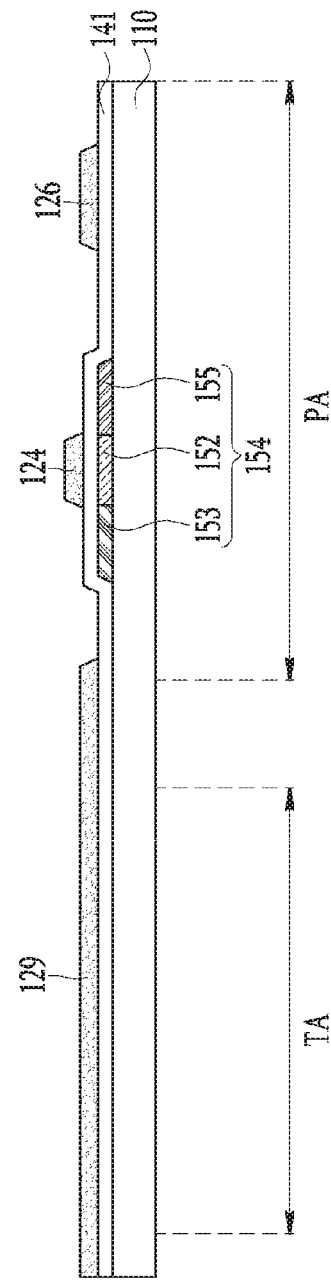
FIGS. 4, 5, 6, 7, 8, 9, 10, 11, and 12 are process cross-sectional views showing a manufacturing method of a display device according to an exemplary embodiment of the present invention.

Referring to FIG. 4, a semiconductor material is deposited on the substrate 110 and is etched to form the semiconductor 154 of the transistor TR. The etching may use a photolithography process. An inorganic insulating material is deposited on the substrate 110 having the semiconductor 154 to form the first gate insulating layer 141, and a conductive material such as a metal is deposited thereon and etched to form the first gate conductor including the gate electrode 124 of the transistor TR, the first electrode 126 of the capacitor C, and an etching preventing layer 129. The source region 153 and the drain region 155 of the semiconductor 154 are formed through impurity doping.

The etching preventing layer 129 is formed to prevent the first gate insulating layer 141 positioned in the transmission area. TA from being etched in a following process. The etching preventing layer 129 may be formed to be extended (e.g., to the border area between the transmission area TA and the pixel area PA) through both sides of the transmission area TA. When the first gate insulating layer 141 is designed to not be positioned in the transmission area TA, the etching preventing layer 129 may not be formed.

Figure 5:
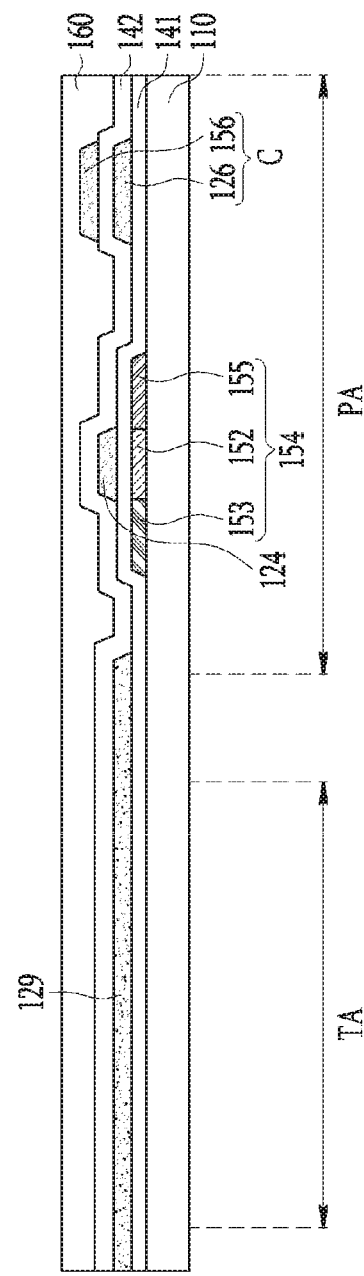

Referring to FIG. 5, an inorganic insulating material is deposited on the first gate insulating layer 141 including the first gate conductor to form the second gate insulating layer 142. Next, a conductive material such as the metal is deposited and etched to form the second gate conductor including the second electrode 156 of the capacitor C. An inorganic insulating material is deposited on the second gate insulating layer 142 having the second gate conductor to form the interlayer insulating layer 160.

Figure 6:
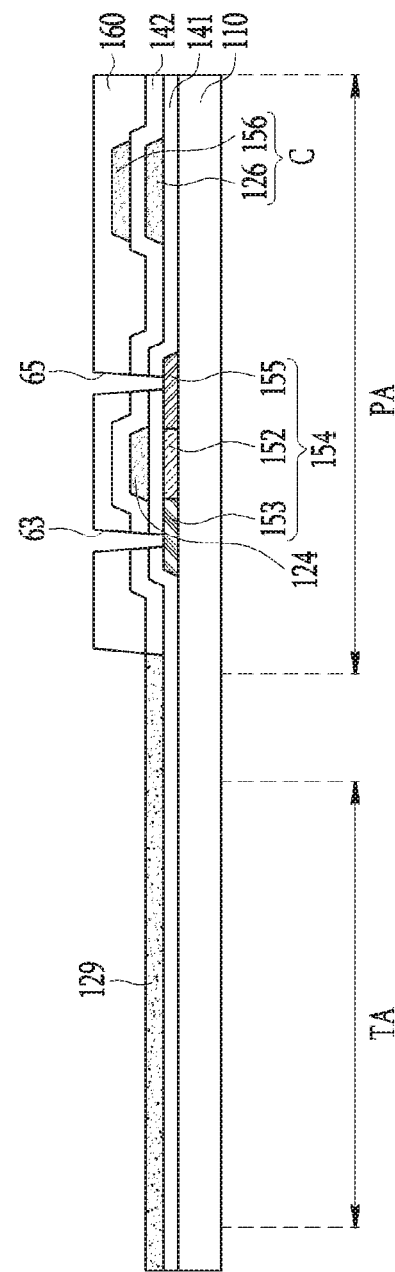

Referring to FIG. 6, the contact holes 63 and 65 overlapping the source region 153 and the drain region 155 of the semiconductor 154 are formed in the interlayer insulating layer 160 and the second gate insulating layer 142. When forming the contact holes 63 and 65, the interlayer insulating layer 160 and the second gate insulating layer 142 on the etching preventing layer 129 are removed. Accordingly, the second gate insulating layer 142 and the interlayer insulating layer 160 are not positioned in the transmission area TA. However, the etching preventing layer 129 is not etched because of etching selectivity between the metal material and the inorganic insulating material when removing the interlayer insulating layer 160 and the second gate insulating layer 142, and the underlying first gate insulating layer 141 also remains.

Figure 7:
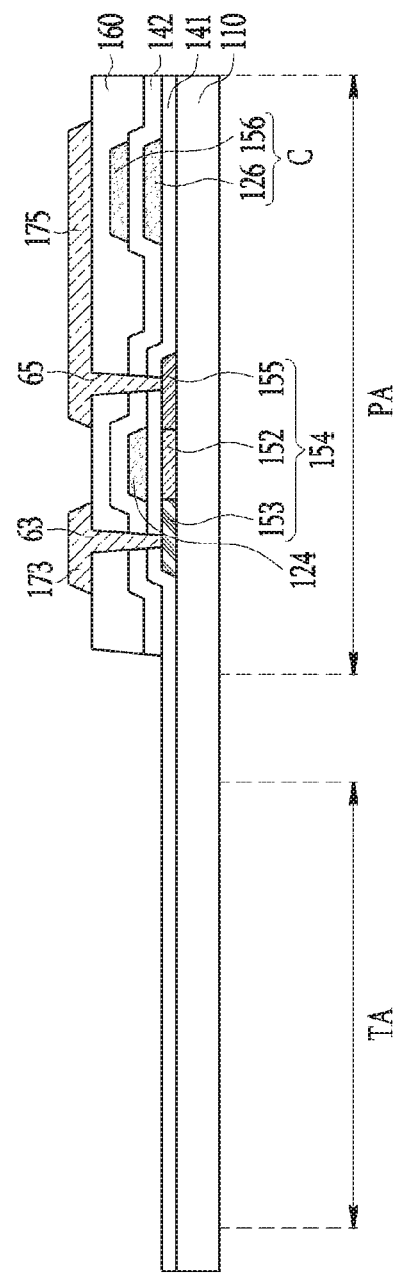

Referring to FIG. 7, a conductive material such as the metal is deposited on the interlayer insulating layer 160 and the etching preventing layer 129 and etched to form the data conductor including the source electrode 173 and the drain electrode 175. In this case, the etching preventing layer 129 on the first gate insulating layer 141 may be removed together therewith. The source electrode 173 and the drain electrode 175 are connected to the source region 153 and the drain region 155 of the semiconductor 154 through the contact holes 63 and 65.

Figure 8:
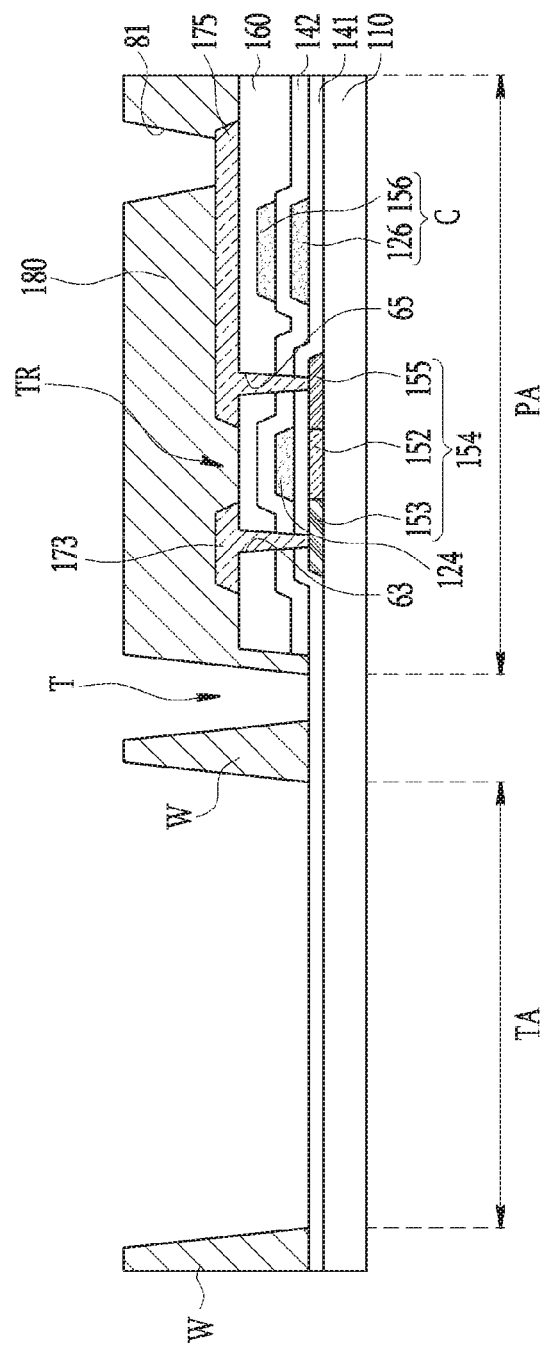

Referring to FIG. 8, an organic insulating material is deposited on the exposed first gate insulating layer 141, and the interlayer insulating layer 160 formed with the data conductor is etched to form the planarization layer 180 having the contact hole 81 overlapping the drain electrode 175 in the pixel area PA and to form the wall W between the transmission area TA and the pixel area PA. Accordingly, the wall W is formed of the same material in the same process as that of the planarization layer 180. The planarization layer 180 is formed on the interlayer insulating layer 160, and the wall W is formed on the first gate insulating layer 141 such that the wall W may be more thickly formed than the interlayer insulating layer 160.

In the transmission area TA, the deposited organic insulating material is removed, thereby exposing the first gate insulating layer 141. The side of the transmission area TA adjacent to the pixel area PA may be limited by the wall W. The wall W is formed to be separated from the planarization layer 180 by the predetermined interval. Accordingly, the trench T defined by the sides of the wall W and the planarization layer 180 is formed therebetween. The bottom of the trench T may be an upper surface of the first gate insulating layer 141.

Figure 9:
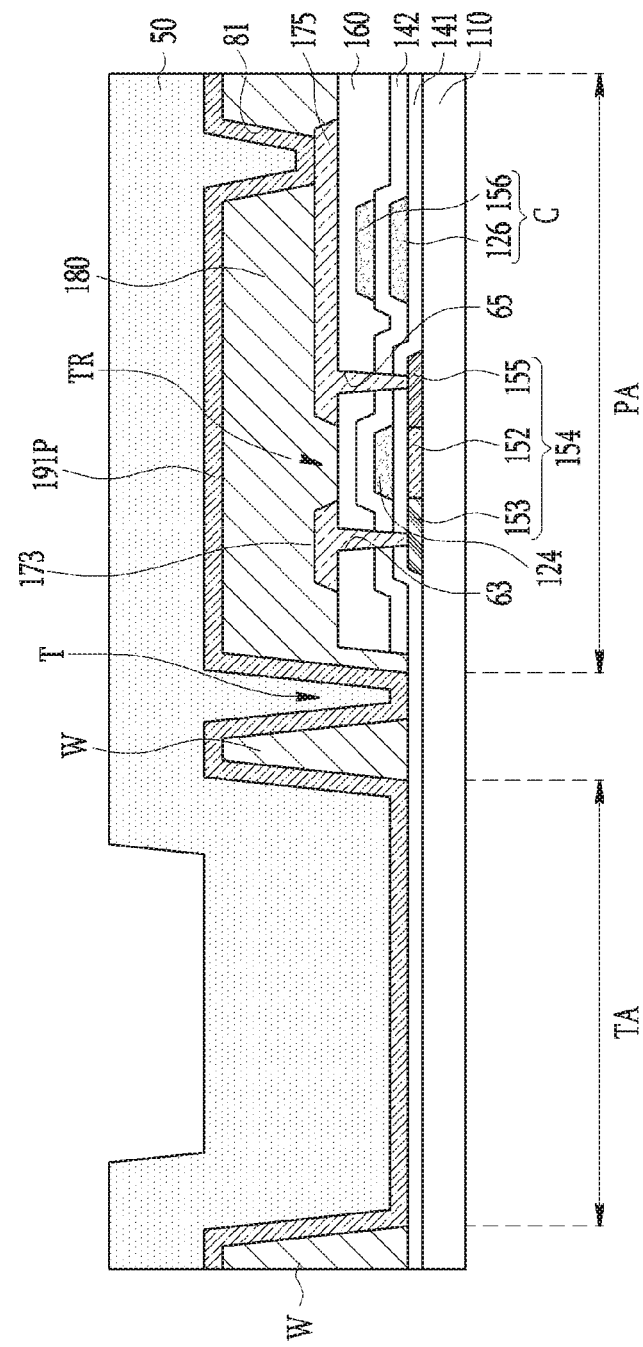
Figure 10:
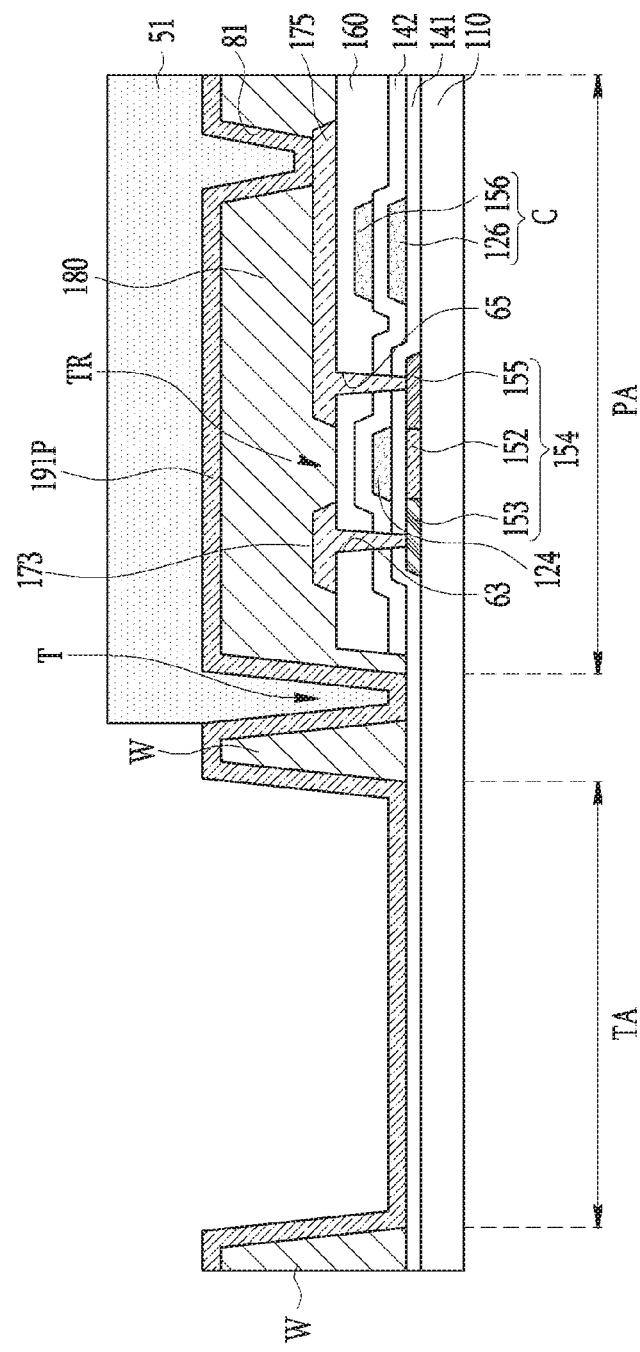
Figure 11:
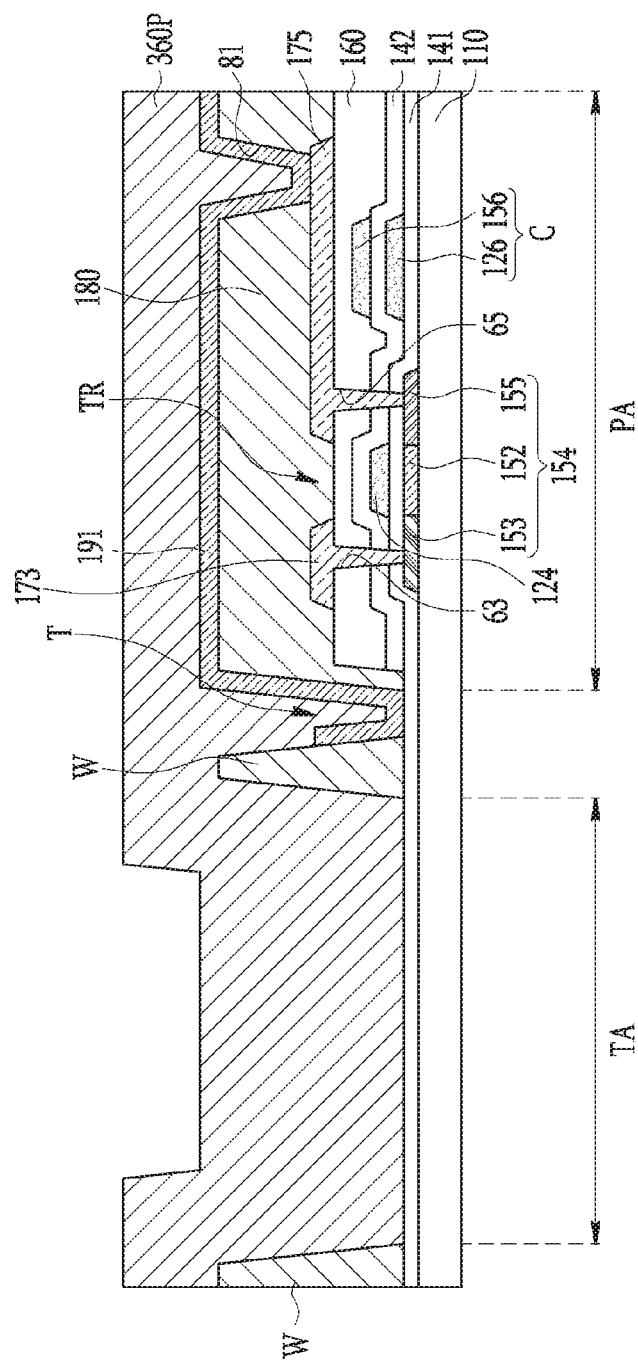
Figure 12:
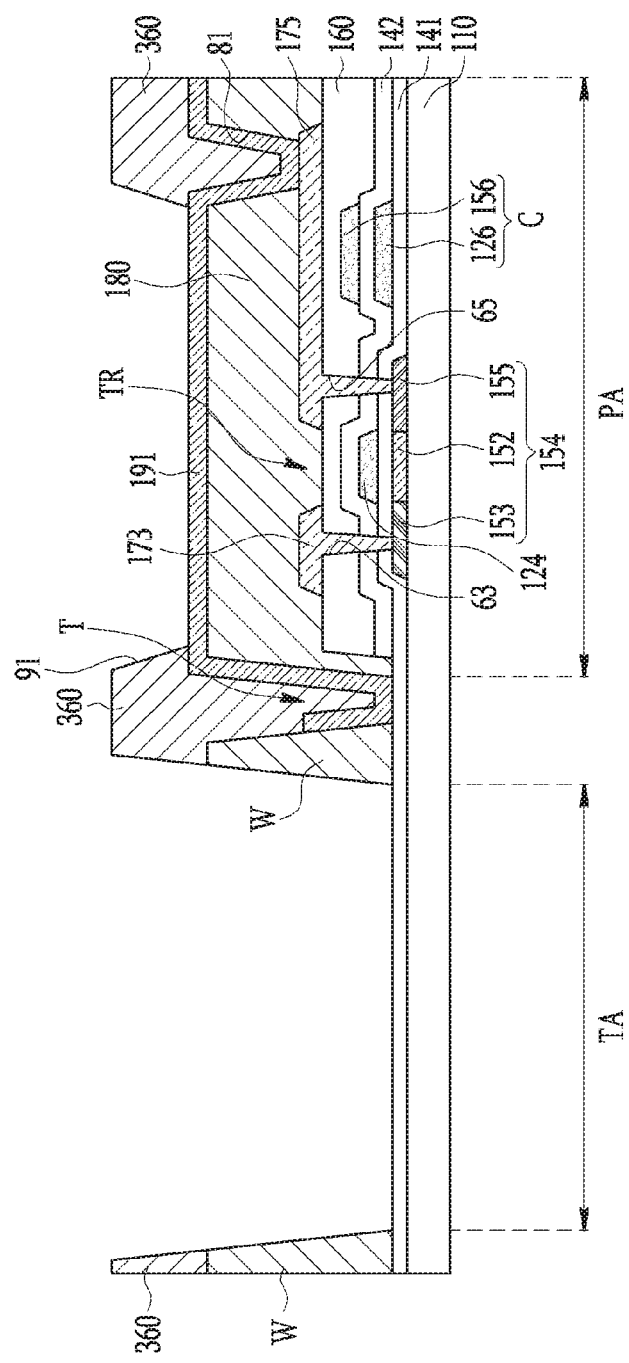

Referring to FIG. 9, a conductive material is deposited on the planarization layer 180, the wall W, the trench T, and the exposed first gate insulating layer 141 to form a conductive layer 191P for the pixel electrode 191. Next, a photoresist is coated on the conductive layer 191P to form a photosensitive film 50. Referring to FIG. 10, a photosensitive film pattern 51 corresponding to the pixel electrode 191 is formed from the photosensitive film 50 through an exposure process using a mask. Next, referring to FIG. 11, the conductive layer 191P is etched by using the photosensitive film pattern 51 as a mask to form the pixel electrode 191, and an organic insulating material is deposited to form an insulating layer 360P for forming the pixel definition layer 360. Referring to FIG. 12, the insulating layer 360P is etched to form the pixel definition layer 360 having the opening 91 overlapping the pixel electrode 191 and covering the edge of the pixel electrode 191. In this case, in the transmission area TA, the insulating layer 360P is removed and only the first gate insulating layer 141 remains. Next, the light emission member 370 and the common electrode 270 are sequentially deposited on the pixel electrode 191 to manufacture the display device shown in FIG. 3.

The planarization layer 180 may be thickly formed, and because the planarization layer 180 is not positioned in the transmission area TA for the transmittance improvement, the step between the transmission area TA and the pixel area PA is large. Accordingly, when forming the photosensitive film 50 by coating the photoresist on the conductive layer 191P, most of the portion of the coated photoresist fills the transmission area TA such that the photosensitive film 50 is formed thinly on the planarization layer 180. For example, the thickness of the photosensitive film 50 on the planarization layer 180 may be less than ⅕ of the thickness of the coated organic insulating material. To compensate this, more photoresist is coated, and the photosensitive film 50 on the planarization layer 180 may not become thicker by a coated amount. Accordingly, to form the photosensitive film 50 of the desired thickness on the planarization layer 180, a large amount of photoresist is generally used.

If the photosensitive film 50 is thinly formed, the edge of the photosensitive film pattern 51 may be lifted and an etchant may penetrate under the photosensitive film pattern 51 in the etching process (e.g., the wet etching) using the photosensitive film pattern 51 such that corrosion of the pixel electrode 191 may occur. However, according to an exemplary embodiment of the present invention, although the photosensitive film 50 is thinly formed on the planarization layer 180 due to the transmission area TA, the edge of the photosensitive film pattern 51 is thickly formed because of the trench T formed between the planarization layer 180 and the wall W as shown in FIG. 10. Accordingly, because the edge of the photosensitive film pattern 51 may not be lifted, the unintended corrosion of the pixel electrode 191 may be prevented. Also, it is not necessary to thickly form the photosensitive film pattern 51 on the planarization layer 180, and as such, a consumption amount of the photoresist may be reduced.

Again referring to FIG. 11, when forming insulating layer 360P for forming the pixel definition layer 360, since an organic insulating material fills the transmission area TA by the step between the transmission area TA and the pixel area PA, the insulating layer 360P is thickly formed in the transmission area TA, but the insulating layer 360P is thinly formed on the planarization layer 180 and the pixel electrode 191. However, because the insulating layer 360P also fills the trench T, as shown in FIG. 12, the sufficiently thick pixel definition layer 360 may be formed on the edge of the pixel electrode 191 positioned in the trench T. Accordingly, even if the edge of the pixel electrode 191 swells, the edge may still be covered by the pixel definition layer 360.

Hereinafter, the display device according to another exemplary embodiment of the present invention will be described focusing on differences from the above-described exemplary embodiment with FIG. 13, FIG. 14, and FIG. 15, and the description for the same configurations is omitted or simplified.

Figure 13:
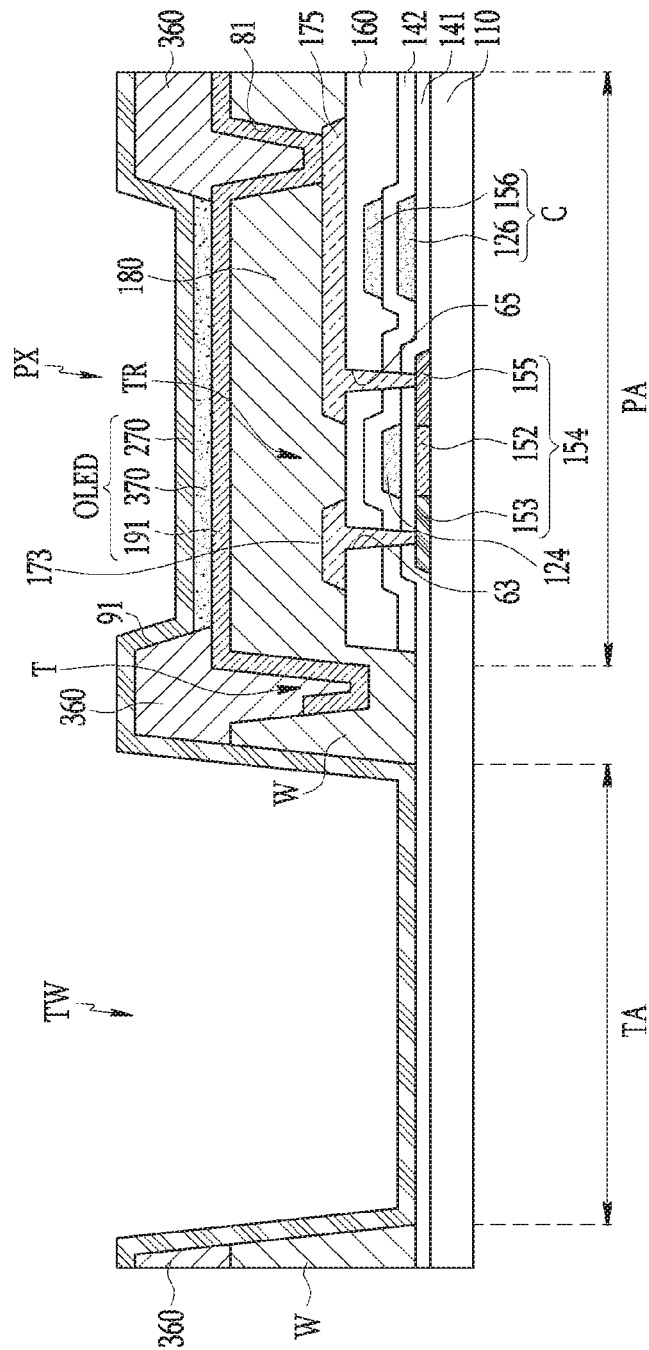
FIG. 13 is a schematic cross-sectional view of a display device according to an exemplary embodiment of the present invention.
Figure 14:
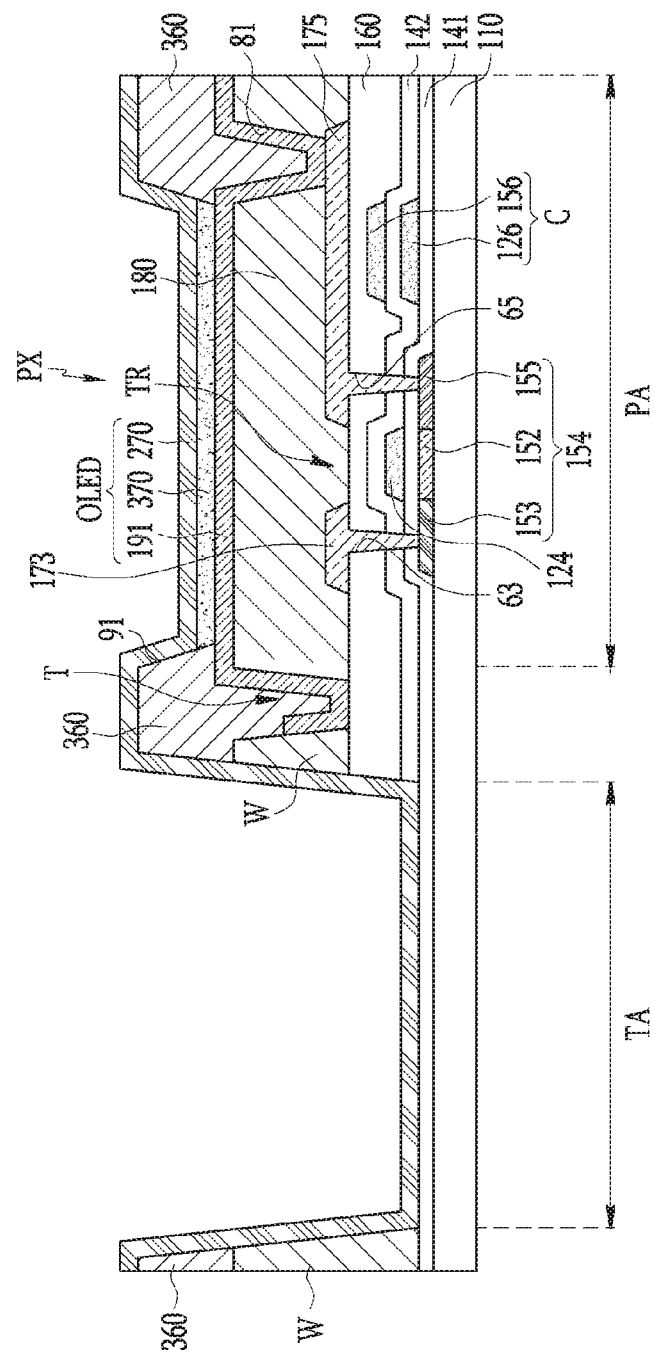
FIG. 14 is a schematic cross-sectional view of a display device according to an exemplary embodiment of the present invention.
Figure 15:
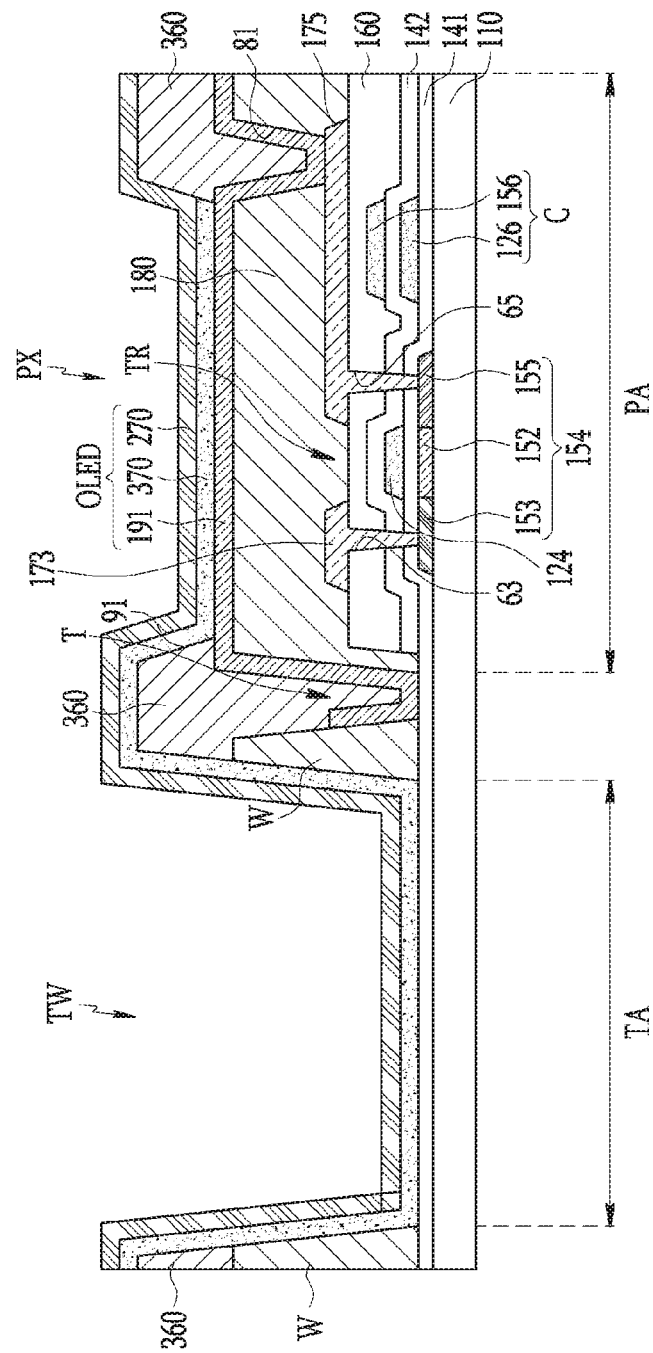
FIG. 15 is a schematic cross-sectional view of a display device according to an exemplary embodiment of the present invention.

FIG. 13, FIG. 14, and FIG. 15 are cross-sectional views of a display device according to an exemplary embodiment of the present invention, respectively.

First, referring to FIG. 13, the wall W is not separated from, but is connected to, the planarization layer 180. Accordingly, the trench T formed between the wall W and the planarization layer 180 is shallower than in the exemplary embodiment of FIG. 3. The wall W and the trench T may be formed by not completely removing the organic insulating layer in the region corresponding to the trench T, for example, by using a half-tone mask or a slit mask when depositing and etching the organic insulating material on the interlayer insulating layer 160 formed with the data conductor. The border area between the transmission area TA and the pixel area PA may increase by the wall W and the trench T, thereby reducing the size of the transmission area TA. If the trench T is shallow, since the width of the trench T may be reduced, the reduction of the size of the transmission area TA may be minimized for the formation of the trench T.

Referring to FIG. 14, differently from the exemplary embodiment of FIG. 3 in which the wall W is positioned on the first gate insulating layer 141, in the present exemplary embodiment, the wall W is positioned on the interlayer insulating layer 160. The trench T formed between the wall W and the planarization layer 180 is shallower than in the exemplary embodiment of FIG. 3, and the upper surface of the interlayer insulating layer 160 forms the bottom of the trench T. If the trench T is shallow, since the width of the trench T may be reduced, like the exemplary embodiment of FIG. 13, the reduction of the size of the transmission area TA may be minimized.

Referring to FIG. 15, differently from the exemplary embodiment of FIG. 3 in which the light emission member 370 is only positioned in the pixel area PA, the light emission member 370 is also positioned in the transmission area TA through the pixel definition layer 360 and the wall W. The light emission member 370 may resultantly be formed continuously in the transverse direction, for example, without a fine metal mask. Even if the light emission member 370 is positioned in the transmission area TA, the light emission member 370 is a transparent thin layer, and as such, the transmittance of the transmitting window TW may not be substantially deteriorated.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
    a substrate including a pixel area and a transmission area adjacent to the pixel area, the transmission area comprising a transmission window;
    a transistor positioned on the substrate in the pixel area;
    a planarization layer positioned on the transistor in the pixel area;
    a wall positioned on the substrate between the pixel area and the transmission area; and
    a pixel electrode positioned on the planarization layer and extending in a trench between the planarization layer and the wall, the pixel electrode positioned to not overlap with the transmission area.

2. The display device of claim 1, wherein
    the wall and the planarization layer are formed of a same material.

3. The display device of claim 1, wherein
    an edge of the pixel electrode is positioned in the trench.

4. The display device of claim 3, further comprising
    a pixel definition layer positioned on the pixel electrode, wherein the pixel definition layer covers the edge of the pixel electrode in the trench.

5. The display device of claim 1, wherein
    the wall is separated from the planarization layer.

6. The display device of claim 1, further comprising
    a gate insulating layer positioned between a semiconductor of the transistor and a gate electrode of the transistor, and
    wherein the wall is positioned directly on the gate insulating layer.

7. The display device of claim 6, wherein
    the pixel electrode is in contact with the gate insulating layer in the trench.

8. The display device of claim 7, further comprising
    a light emission member positioned on the pixel electrode and a common electrode positioned on the light emission member,
    wherein the common electrode is in contact with one side of the wall.

9. The display device of claim 8, wherein
    the light emission member is positioned between the gate insulating layer and the common electrode in the transmission area.

10. The display device of claim 7, further comprising
    a light emission member positioned on the pixel electrode and a common electrode positioned on the light emission member,
    wherein the common electrode is in contact with the gate insulating layer in the transmission area.

11. The display device of claim 1, wherein
    the wall is connected to the planarization layer.

12. The display device of claim 1, further comprising
    an interlayer insulating layer positioned between a gate electrode of the transistor and source and drain electrodes, and
    the wall is positioned directly on the interlayer insulating layer.

13. The display device of claim 1, wherein
    the display device is a transparent display.

14. A method for manufacturing a display device, comprising:
    forming a transistor in a pixel area on a substrate including the pixel area and a transmission area adjacent to the pixel area, the transmission area comprising a transmission window;
    depositing and etching an insulating material in the pixel area and the transmission area to form a planarization layer in the pixel area and to form a wall between the pixel area and the transmission area; and
    depositing and etching a conductive material to form a pixel electrode positioned on the planarization layer and extending in a trench between the wall and the planarization layer,
    wherein the pixel electrode is positioned to not overlap the transmission area.

15. The method of claim 14, wherein
    the pixel electrode is formed for an edge to be positioned in the trench.

16. The method of claim 14, further comprising
depositing and etching an insulating material on the pixel electrode to form a pixel definition layer covering the pixel electrode in the trench.

17. The method of claim 14, further comprising
forming a gate insulating layer on the substrate,
wherein the step of forming the transistor includes depositing and etching a conductive material on the gate insulating layer to form a gate electrode, and
the pixel electrode is formed to be in contact with the gate insulating layer in the trench.

18. The method of claim 14, wherein
an etching preventing layer is formed in the transmission area when forming the gate electrode.

19. The method of claim 14, further comprising
forming a light emission member on the pixel electrode and forming a common electrode on the light emission member,
wherein the common electrode is formed to be in contact with one side of the wall.

20. The method of claim 14, further comprising
forming a gate insulating layer on the substrate; and
forming a light emission member on the pixel electrode and forming a common electrode on the light emission member,
wherein the common electrode is formed to be in contact with the gate insulating layer in the transmission area.

* * * * *